(12) United States Patent
Harbour

(10) Patent No.: US 9,098,485 B2
(45) Date of Patent: Aug. 4, 2015

(54) SCALABLE ARCHITECTURE FOR TESTING WIRELESS DEVICES

(75) Inventor: Peter Joseph Harbour, Framingham, MA (US)

(73) Assignee: AZIMUTH SYSTEMS, INC., Acton, MA (US)

( * ) Notice: Subject to any disclaimer, the term of this patent is extended or adjusted under 35 U.S.C. 154(b) by 1476 days.

(21) Appl. No.: 12/422,442

(22) Filed: Apr. 13, 2009

(65) Prior Publication Data

US 2010/0262410 A1 Oct. 14, 2010

(51) Int. Cl.
G06G 7/62 (2006.01)
G06F 11/26 (2006.01)
G01R 31/28 (2006.01)

(52) U.S. Cl.
CPC .......... *G06F 11/261* (2013.01); *G01R 31/2822* (2013.01)

(58) Field of Classification Search
CPC ........... H04J 3/14; H04L 43/50; H04L 43/00; H04B 17/00
USPC ......... 703/13, 6; 370/241, 281, 335, 337, 350
See application file for complete search history.

(56) References Cited

U.S. PATENT DOCUMENTS

| | | | | |
|---|---|---|---|---|
| 5,764,696 A | * | 6/1998 | Barnes et al. | 375/239 |
| 6,018,644 A | * | 1/2000 | Minarik | 455/82 |
| 7,349,670 B2 | * | 3/2008 | Mlinarsky et al. | 455/67.11 |
| 2006/0229020 A1 | * | 10/2006 | Mlinarsky et al. | 455/67.14 |
| 2008/0232305 A1 | * | 9/2008 | Oren et al. | 370/328 |

OTHER PUBLICATIONS

Spirent, SR4400 Wirless Channel Emulator User Manual, 2001, Spirent. SR5500 Version 3.50, 71-003547, Version A7.*

* cited by examiner

*Primary Examiner* — Andrew Lai
*Assistant Examiner* — Zhiren Qin
(74) *Attorney, Agent, or Firm* — Anderson Gorecki & Rouille LLP

(57) ABSTRACT

A simulator for testing a wireless device includes at least one module capable of being connected with other modules. Each simulator module includes first and second sets of ports, combiners and a channel emulator. Each combiner provides a low insertion loss pathway between a common port and first and second ports of the combiner, and isolation between the first port and the second port of the combiner. The combiners allow interconnection of multiple modules, thereby scaling the number of devices that can be tested by the simulator at a given time.

14 Claims, 6 Drawing Sheets

SCALABLE ARCHITECTURE FOR TESTING WIRELESS DEVICES

FIELD OF THE INVENTION

This invention is generally related to test equipment, and more particularly to scalable test equipment for evaluating wireless devices.

BACKGROUND OF THE INVENTION

Cellular networks and Wireless Local Area Networks ("WLANs") enable communications between mobile wireless devices such as mobile phones and portable computers and fixed location wireless devices such as access points and base stations. It is naturally desirable to test the performance of such devices under different conditions. However, testing wireless devices in an open environment is notoriously difficult because wireless communications can be affected by ambient sources of interference. It is now relatively common to use simulators to perform wireless device testing in a closed environment. One type of simulator includes an EMI-shielded container for each wireless device. Communications are converted from wireless RF to conducted electrical signals, and the containers are placed in communication via wired connections. Emulation modules connected between the containers subject the communications to simulated physical environmental effects including but not limited to multipath reflections, delay spread, angle of arrival, power angular spread, angle of departure, antenna response and geometry, Doppler from moving vehicle, Doppler from changing environments, path loss, shadow fading effects, reflections in clusters, and Doppler due to fluorescent light effects. Simulators provide some advantages over open air testing. However, the architectures of known simulators do not scale well, which is a problem when it is desirable to test interactions between ones of a relatively large number of wireless devices.

DETAILED DESCRIPTION

Figure 1:
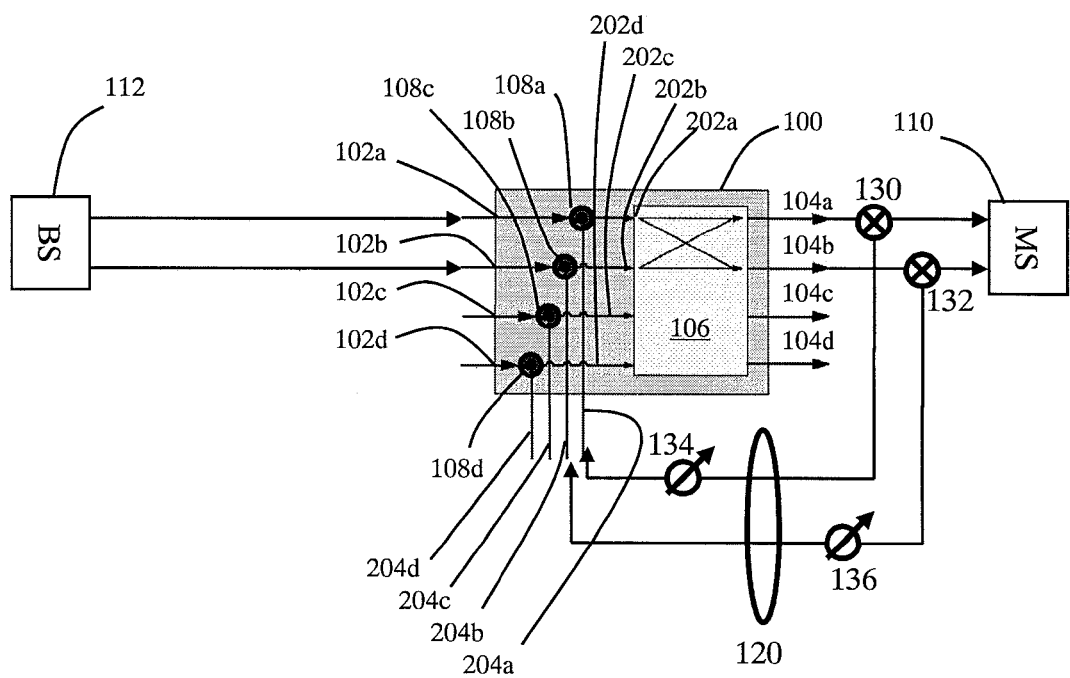
FIG. 1 illustrates a scalable simulator architecture configured for unidirectional 2×2 fading.

FIG. 1 illustrates a wireless environment simulator module 100. The simulator module includes two sets of externally exposed user ports 102a-102d, 104a-104d, a channel emulator 106 and combiners 108a-108d. The simulator module 100 is operable to interconnect a set of two or more wireless devices such as, without limitation, a mobile station 110 such as wireless phones and portable computers, and a fixed-location device 112 such as access points and base stations. Further, the simulator module is operable to simulate effects on communications such as multipath reflections, delay spread, angle of arrival, power angular spread, angle of departure, antenna response and geometry, Doppler from moving vehicle, Doppler from changing environments, path loss, shadow fading effects, reflections in clusters and external interference such as radar signals, microwave oven emissions, phone transmission, Doppler due to fluorescent light effects, and other wireless signals or noise. Further, the simulator module can be scaled by reprogramming, interconnecting multiple simulator modules, or both.

The channel emulator 106 includes digital signal processing circuitry which emulates the effects of a physical environment, e.g., air and interference, on signals in a transmission channel. For example, the channel emulator increases or decreases attenuation or gain to emulate path-loss or fading resulting from movement and changing environmental artifacts. The effects that are emulated by the channel emulator, i.e., the "channel effects," include but are not limited to multipath reflections, delay spread, angle of arrival, power angular spread, angle of departure, antenna spacing, uniform linear array for both TX and RX side, Doppler from moving vehicle, Doppler from changing environments, path loss, shadow fading effects, reflections in clusters and external interference such as radar signals, microwave oven emissions, phone transmission, Doppler due to fluorescent light effects and other wireless signals or noise. Although the channel emulator is illustrated as interconnecting two inputs to two outputs in one direction, reprogramming enables bidirectional or unidirectional connection of any set of inputs with any set of outputs. In particular, the channel emulator may have any number of inputs and outputs, and any input can be connected through the emulator to any set of outputs, including implementation of channel effects.

Figure 2:
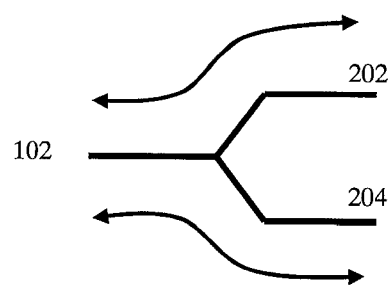
FIG. 2 illustrates the logical combiner component of FIG. 1 in greater detail.

As illustrated in FIG. 2, each combiner provides low insertion loss bidirectional pathways between a common port 102 and a first port 202, and also between the common port 102 and a second port 204, but isolates the first port from the second port in both directions such that signals are not transmittable from the first port to the second port or vice versa. Note that the common port 102 corresponds to external ports 102a-102d (FIG. 1). The combiner may be implemented with a circulator, reactive splitter, duplexer, or other component. The circulator offers the advantage of relatively lower insertion loss, e.g., 1 db, but over a narrow frequency band. In contrast, the reactive splitter offers the advantage of operating over a wider frequency band, but with greater insertion loss, e.g., 3 db. Those skilled in the art will readily understand which components to utilize depending upon the intended use of the device.

The simulator module in FIG. 1 is shown in a basic unidirectional 2×2 fading configuration where signals are transmitted from base station 112 and to mobile station 110. The wireless devices are disposed in first and second housings, respectively, which provide shielding from external electromagnetic interference (EMI). External cabling connects the wireless devices to the simulator module. More specifically, each input port 102a, 102b is associated with a particular antenna of the base station 112 with which it is connected, and each output port 104a, 104b is associated with a particular antenna of the mobile station 110 with which it is connected. The external ports 102a-102d are effectively the common ports (102, FIG. 2) of the different combiners. Consequently, signals transmitted into the simulator module 100 from the base station 112 to external user ports 102a, 102b enter the combiners 108a, 108b via the respective common ports and propagate to the respective first ports 202a, 202b, and subsequently enter the channel emulator 106. Within the channel emulator each input signal is processed in a manner known in the art and the resulting processed signal is provided at either or both outputs 104a, 104b at desired levels. Direct return paths 120 that do not traverse the channel emulator 106 may also be provided with cabling from mobile station 110 to the base station 112 via external combiners 130, 132 if necessary for protocol function. For example, outputs 104a, 104b may be connected to the second ports 204a, 204b respectively of the combiners 108a, 108b. Attenuators 134, 136 may be employed in the paths 120 if necessary. Ports that lack connections for a given configuration may be terminated to mitigate reflections.

Although it is not necessary for RF signals to be transmitted over-the-air because cabling can be connected directly between the simulator module and the wireless devices, it should be understood that RF signals transmitted wirelessly from the devices could be received with an antenna and then propagated to the simulator module via wired connections. Similarly, signals could be transmitted from the simulator module to the devices wirelessly or via wired connections. The choice between wired or wireless connections is not critical to the practice of the invention.

Figure 3:
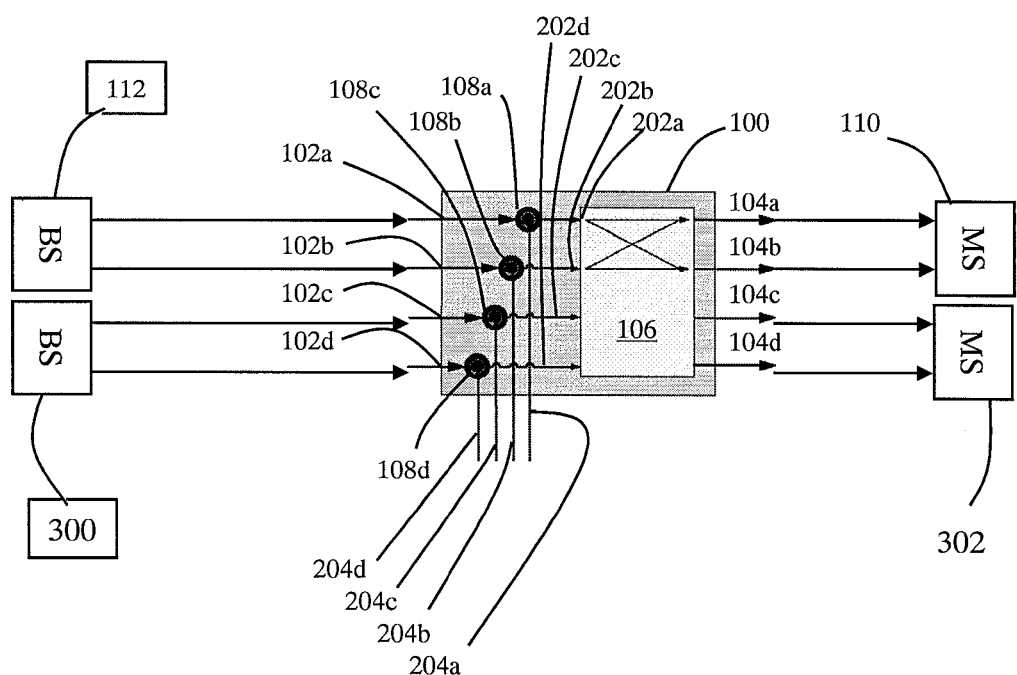
FIG. 3 illustrates the simulator of FIG. 1 configured for independent unidirectional 2×2 fading.

FIG. 3 illustrates the simulator of FIG. 1 configured for independent unidirectional 2×2 fading. Mobile station 110 and base station 112 are connected and tested as already described above. However, in this configuration combiners 108c, 108d and emulator 106 are used to establish a second unidirectional fading test between base station 300 and mobile station 302. The second test is substantially similar to the first test in the sense that signals from base station 300 are provided to the emulator via combiners 108c, 108d. Following processing by the channel emulator, the signals from the base station 300 are provided to mobile station 302. The channel emulator may subject signals from base station 300 to the same effects as signals from base station 112. Alternatively, the channel emulator may subject signals from base station 300 to different effects as signals from base station 112. Both scenarios are possible because different links are associated with base station 112 and base station 300. Further, testing on the different links may be simultaneous, partially overlapping in time, or at different periods in time.

Figure 4:
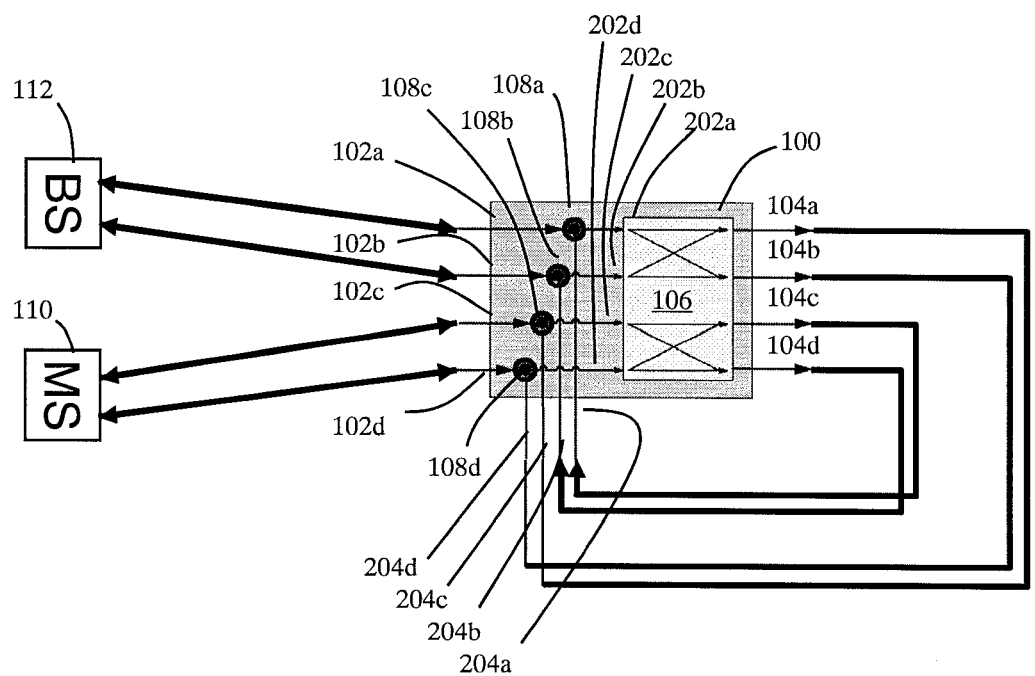
FIG. 4 illustrates the scalable simulator architecture configured for bidirectional 2×2 fading.

As shown in FIG. 4, the simulator can be used to provide bidirectional 2×2 fading. In particular, the outputs 104a, 104b of the channel emulator 106 resulting from signals transmitted by the base station 112 are sent to the respective second ports 204c, 204d respectively of the combiners 108c, 108d connected to the mobile station 110. Similarly, the outputs 104c, 104d of the channel emulator resulting from signals transmitted by the mobile station are sent to the respective second ports 204a, 204b, respectively of the combiners 108a, 108b connected to the base station via the combiners common ports 102a, 102b, respectively. Since the second ports 204a-204d are isolated from the corresponding first ports 202a-202d in each combiner, the signals are not fed back into the channel emulator 106. However, since a low insertion loss path is provided between the corresponding second ports 204a-204d and the common ports 102a-102d in each combiner, the processed signals from the base station 112 are sent to the mobile station 110, and the processed signals from the mobile station are sent to the base station. In other words, bidirectional transmission is provided by using the combiners to direct signals both to and from each device under test via the port or ports with which that device is connected.

Figure 5:
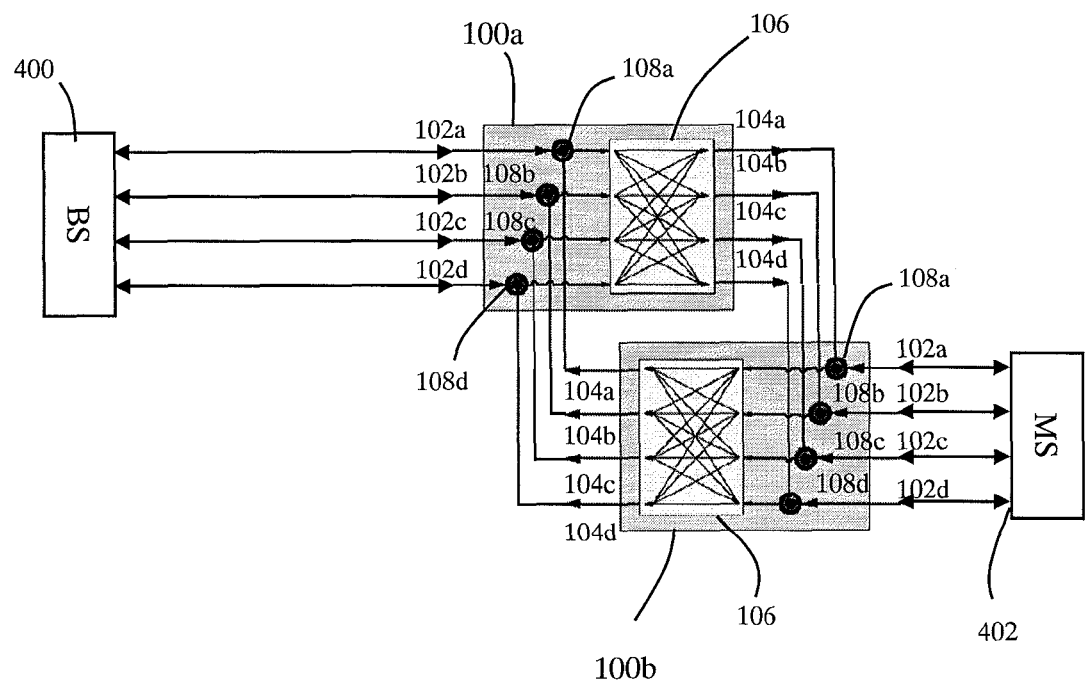
FIG. 5 illustrates the scalable simulator architecture configured for bidirectional 4×4 fading.
Figure 6:
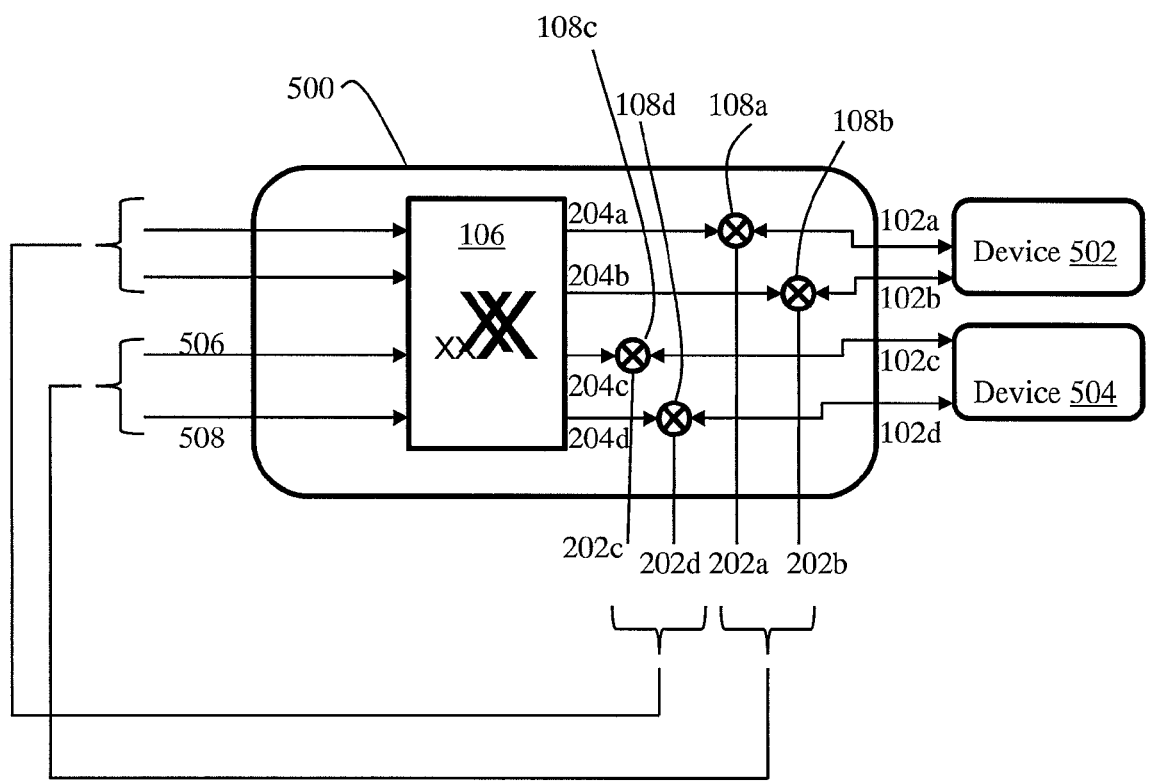
FIG. 6 illustrates an alternative embodiment in which the combiners are connected between the channel emulator and output ports.

Referring to FIG. 5, two simulator modules 100a, 100b can be connected to form a bidirectional 4×4 simulator. The channel emulators 106 in this configuration are reprogrammed relative to the channel emulator of the 2×2 fading configuration such that all four inputs are connected with all four outputs. Signals transmitted by a base station 400 to the first simulator module 100a enter the combiners 108a-108d via common ports 102a-102d and are subsequently processed by the channel emulator 106. The resulting processed signals are provided to the respective combiners 108a-108d of the second simulator 100b, which direct the signals to the mobile station 402. Similarly, signals transmitted by the mobile station 402 to the second simulator module 100b enter the combiners 108a-108d via common ports 102a-102d of simulator module 100b and are propagated to the channel emulator for processing, and the resulting processed signals are provided to the respective combiners 108a-108d of the first simulator 100a which direct the signals to the base station 400. Those skilled in the art will appreciate that the simulator can be further scaled by using additional simulator modules, depending on the number of input and output ports, where the number of input ports need not necessarily equal the number of output ports. It should also be understood that individual simulator modules may include any number of input ports and any number of output ports, and that the number of input ports need not necessarily equal the number of output ports. FIG. 6 illustrates an alternative simulator 500 in which combiners 108a-108d are disposed between a channel emulator 106 and devices 502, 504 with the combiners at the output side of the channel emulator. In particular, combiners 108a, 108b are connected to device 502 via combiner common ports 102a, 102b, thereby providing bi-directional pathways. The combiners 108a, 108b are connected to the channel emulator 106 via combiner second ports 204a, 204b, respectively, thereby providing unidirectional pathways. The combiners 108a, 108b are also connected to inputs 506, 508, respectively, via combiner first ports 202a, 202b, thereby providing unidirectional pathways. Consequently, signals transmitted by device 502 enter combiners 108a, 108b via common ports 102a, 102b, and are directed to ports 202a, 202b. Ports 202a, 202b direct the signals to inputs 506, 508, which direct the signals into the channel emulator 106. The channel emulator processes the signals and directs the resulting processed signals to ports 204c, 204d of combiners 108c, 108d. The combiners 108c, 108d then direct the signals to device 504 via common ports 102c, 102d.

One of the main advantages of the invention is enhanced scalability. In particular, simulator modules can be combined with cabling to increase the number of devices that can be accommodated by a test. Unlike prior art scaling of test equipment, interconnected simulator modules do not require complex wiring and calibration. Further, customers can purchase only the number of modules required to meet their individual scaling requirements, rather than being forced to select from a small number of different devices of greatly different capacity. Depending on implementation, it may also be possible to perform simultaneous independent testing of devices, thereby more fully utilizing the capacity of a channel emulator.

While the invention is described through the above exemplary embodiments, it will be understood by those of ordinary skill in the art that modifications and variations may be made without departing from the inventive concepts. Further, while the preferred embodiments are described in connection with various illustrative structures, one skilled in the art will recognize that the system may be embodied in connection with other structures. Accordingly, the invention should not be viewed as limited except by the scope and spirit of the appended claims.

What is claimed is:

1. A simulator for testing a wireless device, the simulator comprising:

a first module including:
  a first set of ports including at least one port;
  a second set of ports including at least one port;
  a plurality of signal distribution components, each signal distribution component providing a low insertion loss pathway between a common port and a first port and a low insertion loss pathway between the common port and a second port of the signal distribution component, and isolation between the first port of the signal distribution component and the second port of the signal distribution component such that a signal is not coupled between the first port and the second port, ones of the signal distribution components connected to ones of the ports of the first set of ports respectively via the common port of the signal distribution component, and ones of the signal distribution components connected to ones of the ports of the second set of ports via the second port of the signal distribution component; and
  a channel emulator connected to ones of the signal distribution components via the first port of the signal distribution component.

2. The simulator of claim 1 wherein the channel emulator interconnects a first port of a first signal distribution component with a second port of a second signal distribution component.

3. The simulator of claim 1 further including a second module including another first set of ports including at least one port; another second set of ports including at least one port; another plurality of signal distribution components, each providing a low insertion loss pathway between a common port and another first port and a low insertion loss pathway between the common port and another second port of the signal distribution components, and isolation between the another first port and the another second port such that another signal is not coupled between the another first port and the another second port, ones of the another plurality of signal distribution components connected to ones of the ports of the another first set of ports respectively via the common port, and ones of the another plurality of signal distribution components connected to ones of the ports of the another second set of ports via the second port of the signal distribution component; and another channel emulator connected to ones of the another plurality of signal distribution components via the another first port of the signal distribution component, ones of the another second set of ports of the second module connected to the first module, and ones of the second set of ports of the first module connected to the second module.

4. The simulator of claim 3 wherein the channel emulator of the first module interconnects the first ports of the ones of the first module signal distribution components with ones of the second module signal distribution components second ports.

5. The simulator of claim 4 wherein the channel emulator of the second module interconnects ones of the second module signal distribution components first ports with ones of the first module signal distribution components second ports.

6. The simulator of claim 1 wherein the channel emulator includes digital signal processing circuitry which emulates the effects of a physical environment on signals in a transmission channel.

7. The simulator of claim 1 wherein each signal distribution component includes a circulator.

8. The simulator of claim 1 wherein each signal distribution component includes a reactive splitter.

9. The simulator of claim 1 wherein each signal distribution component includes a duplexer.

10. A method for testing a wireless device comprising:
  connecting a first device to a second device via a first module, the first module including:
    a first set of ports including at least one port;
    a second set of ports including at least one port;
    a plurality of signal distribution components, each signal distribution component providing a low insertion loss pathway between a common port of the signal distribution component and a first port and a low insertion loss pathway between the common port and a second port of the signal distribution component, and isolation between the first port of the signal distribution component and the second port of the signal distribution component such that a signal is not coupled between the first port and the second port, ones of the signal distribution components connected to ones of the ports of the first set of ports respectively via the common port of the signal distribution component, and ones of the signal distribution components connected to ones of the ports of the second set of ports via the second port of the signal distribution component; and
    a channel emulator connected to ones of the signal distribution components via the first port of the signal distribution component;
  transmitting a signal by the first device to the second device via first and second ones of the signal distribution components and the channel emulator; and
  storing, by a memory device, an indication of performance of at least one of the first and second devices.

11. The method of claim 10 including interconnecting ones of the signal distribution components first ports with ones of the signal distribution components second ports using the channel emulator.

12. The method of claim 10 including directing a signal from the first device to the second device via a second module including another first set of ports including at least one port; another second set of ports including at least one port; another plurality of signal distribution components, each providing a low insertion loss pathway between a common port and another first port and a low insertion loss pathway between the common port and another second port of the signal distribution components, and isolation between the another first port and the another second port such that another signal is not coupled between the another first port and the another second port, ones of the another plurality of signal distribution components connected to ones of the ports of the another first set of ports respectively via the common port, and ones of the another plurality of signal distribution components connected to ones of the ports of the another second set of ports via the second port of the signal distribution component; and another channel emulator connected to ones of the another plurality of signal distribution components via the another first port of the signal distribution component, ones of the another second set of ports of the second module connected to the first module, and ones of the second set of ports of the first module connected to the second module.

13. The method of claim 12 including interconnecting ones of the first module signal distribution components first ports with ones of the second module signal distribution components second ports using the channel emulator of the first module.

14. The method of claim 13 including interconnecting ones of the second module signal distribution components first ports with ones of the first module signal distribution components second ports using the channel emulator of the second module.

\* \* \* \* \*